United States Patent
Aas et al.

(10) Patent No.: US 11,417,796 B2
(45) Date of Patent: Aug. 16, 2022

(54) LIGHT-EMITTING APPARATUS INCLUDING A REFLECTIVE CAVITY

(71) Applicant: Lumileds LLC, San Jose, CA (US)

(72) Inventors: Mehdi Aas, Eindhoven (NL); Erno Fancsali, Heusden-Zolder (BE); Frans Hubert Konijn, Huizen (NL); Arjen Gerben Van der Sijde, Eindhoven (NL); Nicola Bettina Pfeffer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 89 days.

(21) Appl. No.: 16/701,867

(22) Filed: Dec. 3, 2019

(65) Prior Publication Data

US 2021/0167245 A1 Jun. 3, 2021

(51) Int. Cl.
*H01L 33/10* (2010.01)
*H01L 33/46* (2010.01)
(Continued)

(52) U.S. Cl.
CPC .......... *H01L 33/10* (2013.01); *H01L 25/0753* (2013.01); *H01L 33/0095* (2013.01);
(Continued)

(58) Field of Classification Search
CPC . H01L 33/10; H01L 25/0753; H01L 33/0095; H01L 33/46; H01L 33/60;
(Continued)

(56) References Cited

U.S. PATENT DOCUMENTS

2009/0196060 A1* 8/2009 Sazuka ................ F21S 41/155
362/509
2009/0316384 A1* 12/2009 Kanayama ............ H01L 33/60
362/84

(Continued)

FOREIGN PATENT DOCUMENTS

| EP | 3862628 A1 | 8/2021 |
| FR | 3008475 | 1/2015 |
| JP | 2010137729 | 6/2010 |

OTHER PUBLICATIONS

"European Application Serial No. 20155590.1, Extended European Search Report dated Jul. 3, 2020", 7 pgs.

*Primary Examiner* — Dzung Tran
(74) *Attorney, Agent, or Firm* — Schwegman Lundberg & Woessner, P.A.

(57) ABSTRACT

A light-emitting apparatus can include a reflective cavity that can reflect visible light within the reflective cavity. The reflective cavity can allow the reflected visible light to exit the reflective cavity only at one or more specified emission locations. A visible light-emitting diode can emit visible light into the reflective cavity. An infrared light-emitting diode can emit infrared light into the reflective cavity. A lens can angularly redirect infrared light and visible light that exit the cavity through the one or more emission locations. The reflective cavity can be formed by surfaces at least partially coated with a coating that is reflective for visible light. The coated surfaces can include a circuit board that supports the light-emitting diodes, an incident surface of the lens, and an extension portion of the lens that extends from a flange to the incident surface of the lens.

7 Claims, 8 Drawing Sheets

(51) Int. Cl.
    *H01L 33/60* (2010.01)
    *H01L 25/075* (2006.01)
    *H01L 33/00* (2010.01)

(52) U.S. Cl.
    CPC .............. *H01L 33/46* (2013.01); *H01L 33/60* (2013.01); *H01L 2933/005* (2013.01); *H01L 2933/0033* (2013.01); *H01L 2933/0058* (2013.01)

(58) Field of Classification Search
    CPC ....... H01L 2933/0033; H01L 2933/005; H01L 2933/0058
    USPC ........................................................ 257/79
    See application file for complete search history.

(56) References Cited

U.S. PATENT DOCUMENTS

| | | | |
|---|---|---|---|
| 2010/0060127 A1 | 3/2010 | Sazuka et al. | |
| 2013/0265793 A1* | 10/2013 | Helbig .................... | F21S 41/24 362/538 |
| 2014/0169014 A1* | 6/2014 | Jungwirth ............. | F21S 41/151 362/509 |
| 2016/0040848 A1* | 2/2016 | Tsukamoto ............. | F21S 41/68 362/509 |

\* cited by examiner

US 11,417,796 B2

LIGHT-EMITTING APPARATUS INCLUDING A REFLECTIVE CAVITY

TECHNICAL FIELD

The present disclosure relates to a light-emitting apparatus configured to emit visible and infrared light from a same location.

BACKGROUND

In some applications, such as sensors for autonomous driving vehicles, illumination is provided at one or more infrared wavelengths. Under certain circumstances, such as at night, a human eye can perceive the infrared illumination as being red light.

BRIEF DESCRIPTION OF THE DRAWINGS

The figures show various views of an apparatus, including a lens that can shape light emerging from one or more light emitting diodes (LEDs), in accordance with some embodiments. In the views presented herein, it is assumed that light emerges from a front of the lens, such that the LED or LEDs can be positioned to a rear of the lens. The terms "front," "rear," "top," "side," and other directional terms are used merely for convenience in describing the lens and other elements and should not be construed as limiting in any way.

Figure 1:
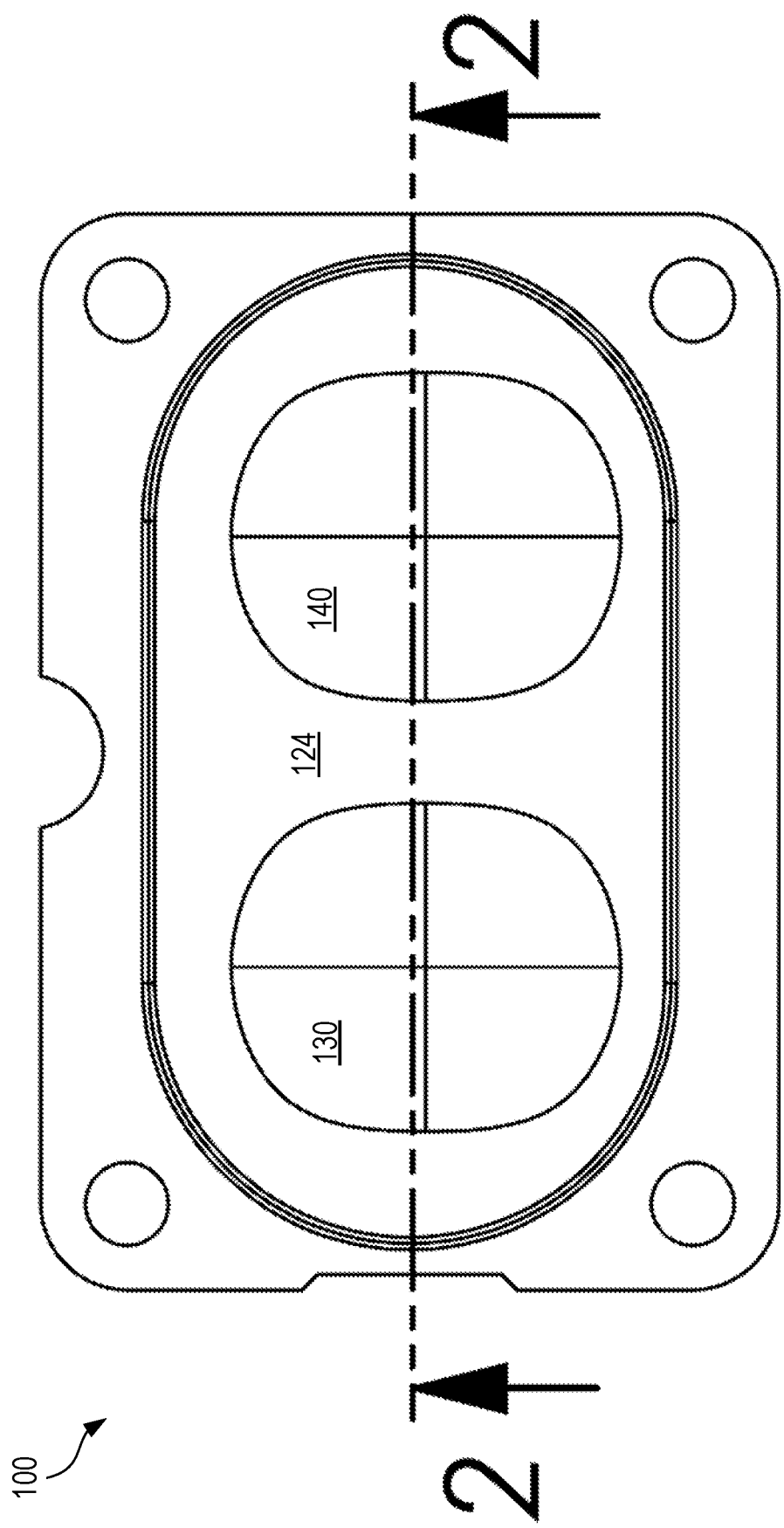
FIG. 1 shows a top view of an example of a light-emitting apparatus, in accordance with some examples.

Corresponding reference characters indicate corresponding parts throughout the several views. Elements in the drawings are not necessarily drawn to scale. The configurations shown in the drawings are merely examples and should not be construed as limiting the scope of the disclosed subject matter in any manner.

DETAILED DESCRIPTION

There are government regulations (such as Society of Automotive Engineers (SAE) J578, a standard defined and promulgated by SAE International) regarding the color of lights positioned on an exterior of a vehicle. In general, for typical passenger vehicles, the government regulations require that lights on the front of a vehicle only emit white light, lights on the left and right sides of a vehicle only emit amber light, and lights on the rear of a vehicle only emit red light. In other countries of the world that do not adhere to the SAE J578 standard, other visible colors of light may be acceptable in various locations on a vehicle.

Modern safety systems on a vehicle can produce images of the vehicle's surroundings, or retrieve data regarding the vehicle's surroundings, for use in accident prevention and object avoidance. In addition, autonomous driving or assisted-driving applications can also retrieve data regarding the vehicle's surroundings. Because the government regulations place requirements on light emitted from the vehicle for wavelengths up to 780 nm and are silent regarding infrared light emitted at wavelengths longer than 780 nm, using such infrared light to illuminate the vehicle's surroundings can benefit the safety systems on the vehicle.

For example, illuminating the surroundings, rather than relying on reflections of ambient light, can be beneficial because illumination can allow the safety system to operate at night. Using infrared light for illumination, rather than illuminating with visible light, can be beneficial because infrared light is largely invisible to the human eye and does not create issues for other vehicle drivers. Further, using a specific, and relatively narrow, wavelength range for illumination and detection can be beneficial, because the illumination and detection can occur at a brightness level that can be significantly larger than what is present in ambient sunlight. For example, if illumination and detection occur in a relatively narrow infrared wavelength range centered about 940 nm (or another suitable infrared wavelength), it can be straightforward to illuminate with enough power to drown out any illumination effects caused by ambient sunlight or by other light-emitting elements in the surroundings. The power used for such narrowband illumination and detection can be small enough to avoid damaging eye tissue or other living tissue in the surroundings.

However, illuminating the surroundings with infrared light can cause an unexpected problem. As an artifact of human vision, the emissions from an infrared light source can spuriously be perceived by the human eye as being red. Specifically, while the infrared light reflected from the surroundings can be at an intensity low enough to be invisible to the human eye, a viewer looking directly into the infrared light source may view the relatively high intensity of the light source as spuriously glowing red. As the emitting wavelengths increase (and, therefore, move farther away from the long-wavelength end of the visible spectrum, which is typically considered to be around 700 nm), the spurious effect decreases, but is still present.

As a result, simply placing an infrared source on the front or sides of a vehicle can be problematic, because to the human eye, such a source would be perceived as a red light, which is prohibited by the government regulations. To overcome the problem of the infrared light source positioned on a front or sides of a vehicle exterior being perceived as a red light, a visible light source of a permitted color can be positioned in close proximity to the infrared light source. Visible light emitted from the visible light source can overlap with and mask the infrared light emitted from the infrared light source. The infrared and visible light sources, together, are perceived by the human eye as being a single light emitter having a color of the visible light source. Thus, a white light source can be used on a front of the vehicle, while an amber light source can be used on sides of the vehicle.

The apparatus discussed herein can be suitable for providing the infrared and visible light discussed above. The apparatus can include a lens that can shape a beam output from one or more infrared light-emitting diodes, for example, to provide infrared illumination at a specified brightness over a specified angular range. The apparatus can further superimpose light from one or more visible light-emitting diodes on the infrared light, to address the spurious viewing issues discussed above. To superimpose the visible and infrared lights, the apparatus can employ a reflective cavity. The cavity can reflect visible light within the cavity and allow the visible (and infrared) light to exit the cavity only at one or more specified locations. Allowing the light to exit the cavity only in specified locations can increase the effectiveness of the apparatus. For example, compared to a device in which infrared light and visible light emerge from separate locations, the present apparatus can improve performance of the apparatus at relatively close distances from the apparatus. At these relatively close distances, the present apparatus beneficially does not show any separation between the visible and infrared lights.

In a specific configuration, a light-emitting apparatus can include a circuit board at least partially coated with a coating that is reflective for visible light. A visible light-emitting diode and an infrared light-emitting diode can be mounted on the circuit board and can emit visible light and infrared light, respectively. A lens mounted on the circuit board can include an incident surface that faces the visible light-emitting diode and the infrared light-emitting diode. The incident surface can be at least partially coated with a coating that is reflective for visible light. The incident surface can include a non-reflective area that lacks a reflective coating. The non-reflective area can be positioned proximate the infrared light-emitting diode and can allow at least a portion of the emitted light to pass through the incident surface of the lens. The lens can angularly redirect the light that passes through the non-reflective area.

As used herein, the phrase generally planar is intended to mean planar to within typical manufacturing tolerance and/or typical alignment tolerances. For the purposes of this document, a vertical-cavity surface-emitting laser can be considered to be a light-emitting diode. For the purposes of this document, the use of the term visible light can be generalized to light having a first wavelength, and the use of the term infrared light can be generalized to light having a second wavelength different from the first wavelength, where the first wavelength and/or the second wavelength can be in the ultraviolet portion of the electromagnetic spectrum, the visible portion of the portion of the electromagnetic spectrum, or the infrared portion of the electromagnetic spectrum.

Figure 2:
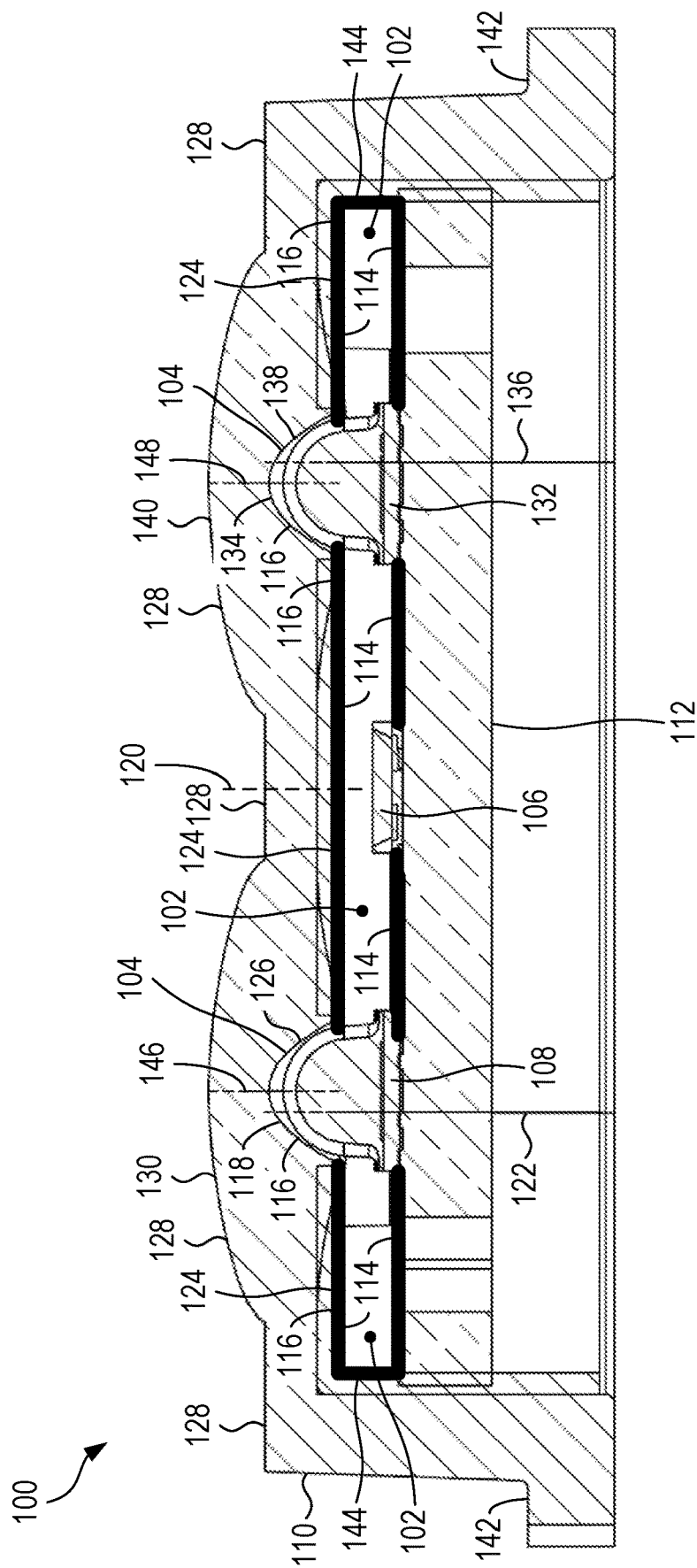
FIG. 2 shows a side-view cross-section of the light-emitting apparatus of FIG. 1, in accordance with some examples.

FIG. 1 shows a top view of an example of a light-emitting apparatus 100, in accordance with some examples. FIG. 2 shows a side-view cross-section of the light-emitting apparatus 100 of FIG. 1, in accordance with some examples. In the example of FIGS. 1 and 2, because the visible and infrared light can exit a reflective cavity only at one or more specified locations, the light-emitting apparatus 100 can be effective for providing the infrared and visible light as discussed above. The configuration of FIGS. 1 and 2 is but one suitable configuration for a light-emitting apparatus 100; other suitable configurations can also be used.

The light-emitting apparatus 100 can include a reflective cavity 102 that can reflect visible light within the reflective cavity 102 and can allow the reflected visible light to exit the reflective cavity 102 only at one or more specified emission locations 104. A visible light-emitting diode 106 can emit visible light into the reflective cavity 102. An infrared light-emitting diode 108 can emit infrared light into the reflective cavity 102. A lens 110 can angularly redirect infrared light and visible light that exit the cavity 102, together, through the one or more emission locations 104. The visible light-emitting diode 106, the infrared light-emitting diode 108, and the lens 110 can be mounted on a circuit board 112, which can mechanically support and electrically power the infrared light-emitting diode 108 and the visible light-emitting diode 106. The circuit board 112 can be at least partially coated with a coating 114 that is reflective for visible light, such that the coated portion of the circuit board 112 forms a portion of the reflective cavity 102. FIG. 2 shows the coating 114 as being a thickened line that outlines a generally rectangular cavity 102 that is elongated along a horizontal direction. These elements are discussed in detail below.

The lens 110 can include an incident surface 116 that faces the visible light-emitting diode 106 and the infrared light-emitting diode 108. The incident surface 116 can be at least partially coated with a coating 114 that is reflective for visible light. The coated portion of the incident surface 116 can form a portion of the reflective cavity 102. The incident surface 116 can include a non-reflective area 118 that lacks a reflective coating 114. The non-reflective area 118 of the incident surface 116 can form the one or more specified emission locations 104.

In the configuration of FIGS. 1 and 2, the non-reflective area 118 can be positioned proximate the infrared light-emitting diode 108 and can allow at least a portion of the visible light and at least a portion of the infrared light to pass through the incident surface 116 of the lens 110. In the configuration of FIGS. 1 and 2, the infrared light can pass directly from the infrared light-emitting diode 108 to the non-reflective area 118 of the incident surface 116, which can be beneficial, as explained below. In other configurations, the non-reflective area 118 can be positioned away from the infrared light-emitting diode 108.

In some examples, the visible light-emitting diode 106 can be oriented to emit the visible light in an angular distribution that is centered around a first axis 120. In some examples, the infrared light-emitting diode 108 can be oriented to emit the infrared light in an angular distribution that is centered around a second axis 122. In some examples, the second axis 122 can be generally parallel to the first axis 120. For example, the axes 120, 122 can be parallel to within typical manufacturing and alignment tolerances. In other examples, the second axis 122 can be angled with respect to the first axis 120. In some examples, the second axis 122 can extend from the infrared light-emitting diode 108 to the non-reflective area 118 of the incident surface 116, which can also be beneficial, as explained below. In other configurations, the second axis 122 can extend from the infrared light-emitting diode 108 to the coated portion of the incident surface 116. In some configurations, the visible light-emitting diode 106 can optionally be a side-emitting light-emitting diode, which can emit visible light directly into the reflective cavity 102 or emit visible light toward a reflector that reflects the light toward the incident surface 116. In some configurations, the infrared light-emitting diode 108 can optionally be a side-emitting light-emitting diode, which can emit light toward a reflector that reflects the light toward the incident surface 116.

In some examples, the incident surface 116 of the lens 110 can include a generally planar portion that is at least partially coated with a coating 114 that is reflective for visible light. The generally planar portion 124 can be smooth (e.g., supporting a specular reflection), textured (e.g., supporting a diffuse reflection), or a combination of smooth in one or more areas and textured in one or more areas.

In some examples, the incident surface 116 of the lens 110 can include a concave portion 126 surrounded by the generally planar portion 124. The concave portion 126 can lack a reflective coating 114 and can form the non-reflective area 118.

The lens 110 can include an exiting surface 128 opposite the incident surface 116. In some examples, the exiting surface 128 can include a convex portion 130 opposite the concave portion 126 of the incident surface 116. The concave portion 126 of the incident surface 116 and the convex portion 130 of the exiting surface 128 can be shaped to angularly redirect the infrared light from the infrared light-emitting diode 108.

In some examples, the concave portion 126 of the incident surface 116 and the convex portion 130 of the exiting surface 128, combined, can have a negative optical power, which can angularly widen an infrared light output distribution from the infrared light-emitting diode 108, and can optionally provide a uniform or near-uniform brightness over a specified field of view. The desired light output can be achieved most simply if the infrared light exits the infrared light-emitting diode 108 and directly strikes the concave portion 126 of the incident surface 116 directly, without additional reflection or redirection, and then directly strikes the convex portion 130 of the exiting surface 128. The concave and convex curvatures (or, equivalently, radii of curvature) can be selected to achieve the specified brightness over a specified field of view. Alternatively, it is possible to include redirection of the infrared light, with suitable values for curvatures (or radii of curvature).

In some examples, a second infrared light-emitting diode 132 can be mounted on the circuit board 112 and can emit infrared light. The second infrared light-emitting diode 132 can emit light at the same wavelength as the infrared light-emitting diode 108, or at a different wavelength. In some examples, the visible light-emitting diode 106 can be positioned between the infrared light-emitting diode 108 and the second infrared light-emitting diode 132.

To accommodate the second infrared light-emitting diode 132, the incident surface 116 can include a second non-reflective area 134 that lacks a reflective coating 114. In some examples, the second non-reflective area 134 can be positioned proximate the second infrared light-emitting diode 132 and can allow at least a portion of the visible light and at least a portion of the infrared light to pass through the incident surface 116 of the lens 110.

The second infrared light-emitting diode 132 can be oriented to emit the infrared light in an angular distribution that is centered around a third axis 136. In some examples, the third axis 136 can be generally parallel to the first axis 120 and the second axis 122. In some examples, the third axis 136 can extend from the second infrared light-emitting diode 132 to the second non-reflective area 134.

To accommodate the second infrared light-emitting diode 132, the incident surface 116 can include a second concave portion 138 surrounded by the generally planar portion 124. The second concave portion 138 can also lack a reflective coating 114 and can form the second non-reflective area 134.

To accommodate the second infrared light-emitting diode 132, the exiting surface 128 can include a second convex portion 140 opposite the second concave portion 138 of the incident surface 116. The second concave portion 138 of the incident surface 116 and the second convex portion 140 of the exiting surface 128 can be shaped to angularly redirect the infrared light from the second infrared light-emitting diode 132.

In some examples, a distance between the infrared light-emitting diode 108 and the non-reflective area 118 can be substantially equal to a distance between the second infrared light-emitting diode 132 and the second non-reflective area 134. In some of these examples, a curvature of the concave portion 126 of the incident surface 116 can be substantially equal to a curvature of the second concave portion 138 of the incident surface 116. In some of these examples, a curvature of the convex portion 130 of the exiting surface 128 can be substantially equal to a curvature of the second convex portion 140 of the exiting surface 128. Other suitable distances and curvatures can also be used.

Note that the geometry by which the concave portion 126 intersects the second axis 122 can ensure that the concave portion 126 receives a largely central portion of the light emitted from the infrared light-emitting diode 108. As a result, the concave portion 126 can receive most of the light emitted by the infrared light-emitting diode 108. Light emitted away from the largely central portion (e.g., a peripheral portion) can optionally strike the incident surface 116 away from the concave portion 126, or, for rays at the very periphery of the angular distribution, may optionally miss the incident surface 116 entirely. Separating the peripheral portion from the central portion in this manner can improve a uniformity of light emerging from the lens 110. Similar geometry applies to the second concave portion 138 and the third axis 136.

The concave portion 126 can be substantially centered around a concave portion axis 146 that is non-coaxial with the first axis 120. As a result, the infrared light-emitting diode 108 and the concave portion 126, taken together, may not be rotationally symmetric about a common axis. This can lead to an intentional asymmetry in the light emerging from the lens 110. In some examples, by using multiple LEDs and multiple lenses, the intentional asymmetries can be combined to form a specified illumination pattern. In some examples, the concave portion axis 146 can be parallel to and offset from the first axis 120. In other examples, the concave portion axis 146 can be angled (or angularly skewed) with respect to the first axis 120. Similar geometry applies to a second concave portion axis 148 and the third axis 136.

In some examples, the concave portion 126 can be rotationally asymmetric about the concave portion axis 146. The effect of such an asymmetry is that the concave portion 126 can widen the light from the infrared light-emitting diode 108 by different amounts along different directions. In some examples, such asymmetry can arise as different radii of curvature for different cross-sectional directions of the concave portion 126 (e.g., different slices of the concave portion 126, each slice being a plane that includes the concave portion axis 146). In some examples, such asymmetry can arise as different surface sags along different cross-sectional directions, where the surface sag can be defined as zero at the intersection of the concave portion axis 146 and the concave portion 126, and a longitudinal component of distance away from the intersection (e.g., a component of distance that is parallel to the concave portion axis 146). In some examples, the concave portion 126 can have a first radius of curvature (or a first surface sag) along a first direction, and a second radius of curvature (or a second surface sag) along a second direction, which is typically orthogonal to the first direction. In some examples, the concave portion 126 can be anamorphic or cylindrical. As an alternative, the concave portion 126 can optionally be rotationally symmetric about the concave portion axis 146.

Similar geometry applies to the second concave portion 138 and the second concave portion axis 148.

A perimeter of the lens 110 can include a flange 142 that can mechanically support the lens 110. In some examples, the lens 110 can have an extension portion 144 that extends from the flange 142 to the incident surface 116. In some examples, the extension portion 144 can be generally parallel to the first axis 120 and the second axis 122. In some examples, the extension portion 144 can be at least partially coated with a coating 114 that is reflective for visible light. In some examples, the coated portion of the extension portion 144 can form a portion of the reflective cavity 102.

FIGS. 3-7 show optional features that can additionally be included with the apparatus 100 of FIGS. 1 and 2. For simplicity, the reference numerals for the features of FIGS. 1 and 2 have been omitted from the configurations of FIGS. 3-7. It will be understood that any or all the features of FIGS. 1 and 2 can be present in the configurations of FIGS. 3-7, except where noted.

Figure 3:
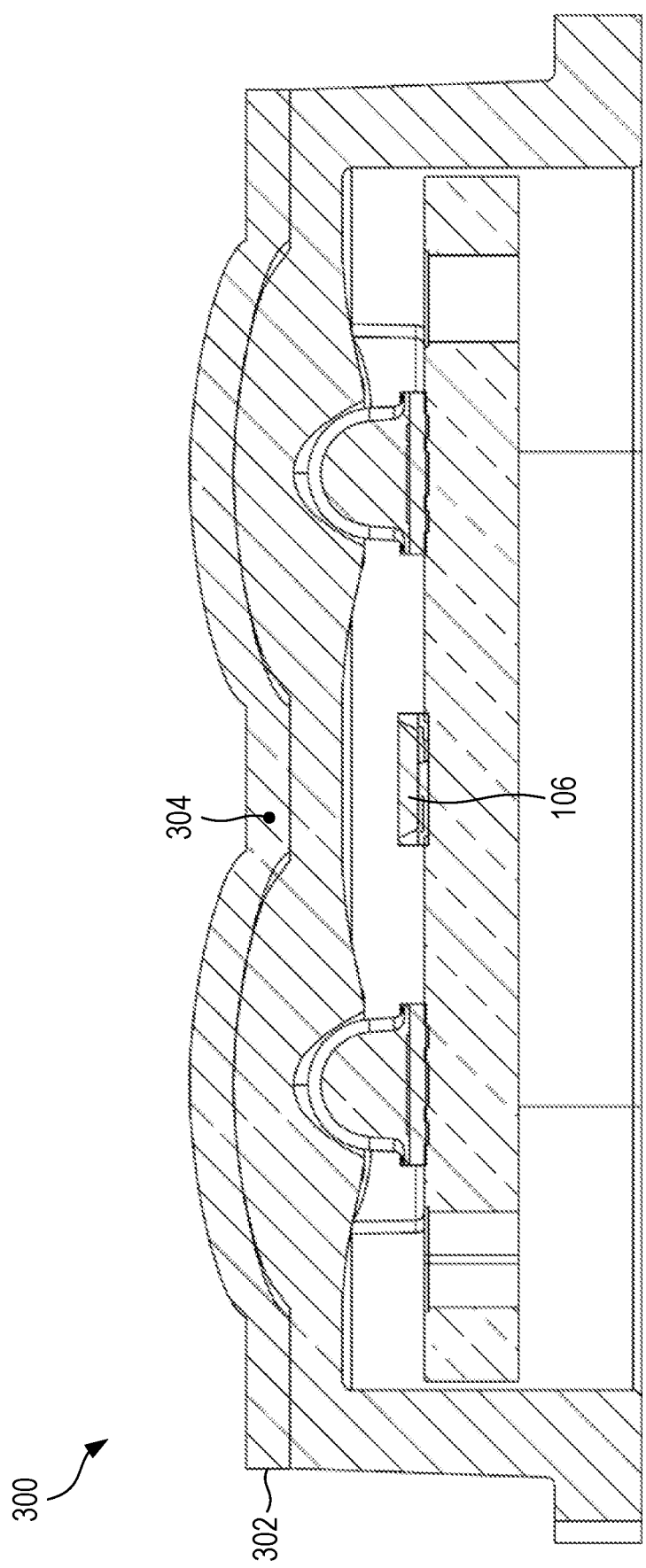
FIG. 3 shows a side-view cross-section of another example of a light-emitting apparatus, in accordance with some examples.

FIG. 3 shows a side-view cross-section of another example of a light-emitting apparatus 300, in accordance with some examples. Compared with the apparatus 100 of FIGS. 1 and 2, the apparatus 300 can additionally include a layer 302 disposed on the exiting surface of the lens. The layer 302 can be formed from a material that is substantially opaque or substantially reflective for visible light, but substantially transmissive for infrared light. The layer 302 can optionally be textured, such as in the region adjacent to the visible light-emitting diode 106.

The lens can be formed from material 304 that is substantially transparent (e.g., substantially non-absorbing) for infrared light and visible light. Infrared light that strikes the layer 302 may pass substantially through the layer 302, with a relatively small amount of absorption or reflection. Visible light that strikes the layer 302 can be reflected or absorbed. Reflected visible light can remain within the device and can, after one or more reflections within the device, can exit the device through one or more portions of the exiting surface that are devoid of the layer 302. The layer 302 of FIG. 3 can be used in combination with the cavity of FIGS. 1 and 2, or can replace the reflective material that forms the cavity of FIGS. 1 and 2.

Figure 4:
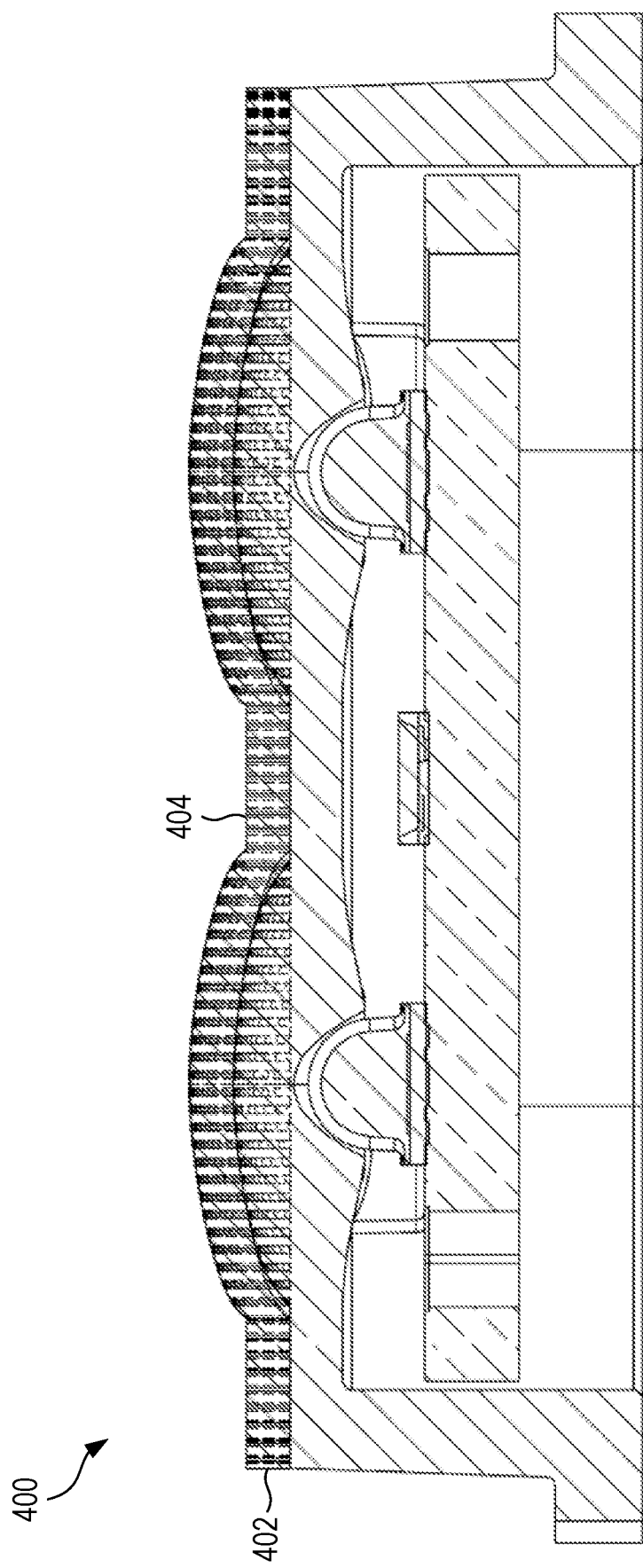
FIG. 4 shows a side-view cross-section of another example of a light-emitting apparatus, in accordance with some examples.

FIG. 4 shows a side-view cross-section of another example of a light-emitting apparatus 400, in accordance with some examples. Compared with the apparatus 300 of FIG. 3, the apparatus 400 can additionally include a plurality of holes 404 that extend through the layer 402 to the exiting surface of the lens.

Visible light that strikes the layer 402 away from a hole 404 can be absorbed by the layer 402 or reflected by the layer 402. Infrared light that strikes the layer 402 may pass substantially through the layer 402, with a relatively small amount of absorption or reflection. In some example, the size and/or placement of the holes can vary across the layer 402, such that the layer 402 can appear more transparent (e.g., with more holes) in the curved portions above the infrared light-emitting diodes, and more opaque (e.g., with fewer holes) away from the curved portions above the infrared light-emitting diodes. The layer 402 of FIG. 4 can be used in combination with the cavity of FIGS. 1 and 2 or can replace the reflective material that forms the cavity of FIGS. 1 and 2.

Figure 5:
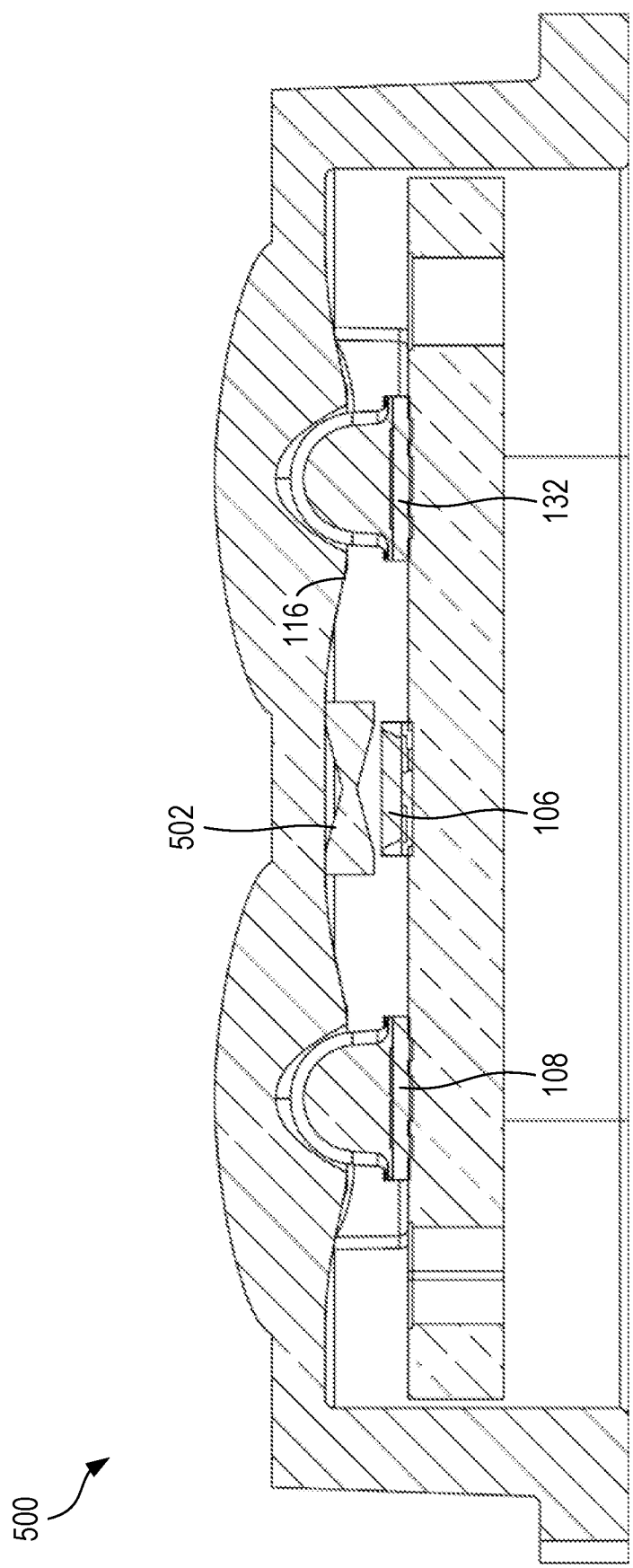
FIG. 5 shows a side-view cross-section of another example of a light-emitting apparatus, in accordance with some examples.

FIG. 5 shows a side-view cross-section of another example of a light-emitting apparatus 500, in accordance with some examples. Compared with the apparatus 100 of FIGS. 1 and 2, the apparatus 500 can additionally include a refractive prism 502 disposed between the visible light-emitting diode 106 and the incident surface 116 of the lens. Visible light from the visible light-emitting diode 106 can enter the refractive prism 502 through a front face of the refractive prism 502, reflect off a rear face of the refractive prism 502, exit the refractive prism 502 through a side face of the refractive prism 502, and pass toward the infrared light-emitting diode 108 and/or the second infrared light-emitting diode 132. The visible light can reflect from the infrared light-emitting diode 108 and/or the second infrared light-emitting diode 132 and be directed out of the light-emitting apparatus 500 along the same optical path as the infrared light that is generated at the infrared light-emitting diode 108 and/or the second infrared light-emitting diode 132. The refractive prism 502 of FIG. 5 can be used in combination with the cavity of FIGS. 1 and 2, or can replace the reflective material that forms the cavity of FIGS. 1 and 2. The refractive prism 502 of FIG. 5 can be used in combination with the cavity of FIGS. 1 and 2, or can replace the reflective material that forms the cavity of FIGS. 1 and 2. The refractive prism 502 can also be used in combination with the layer 302 of FIG. 3 or the layer 402 with holes 404 of FIG. 4.

Figure 6:
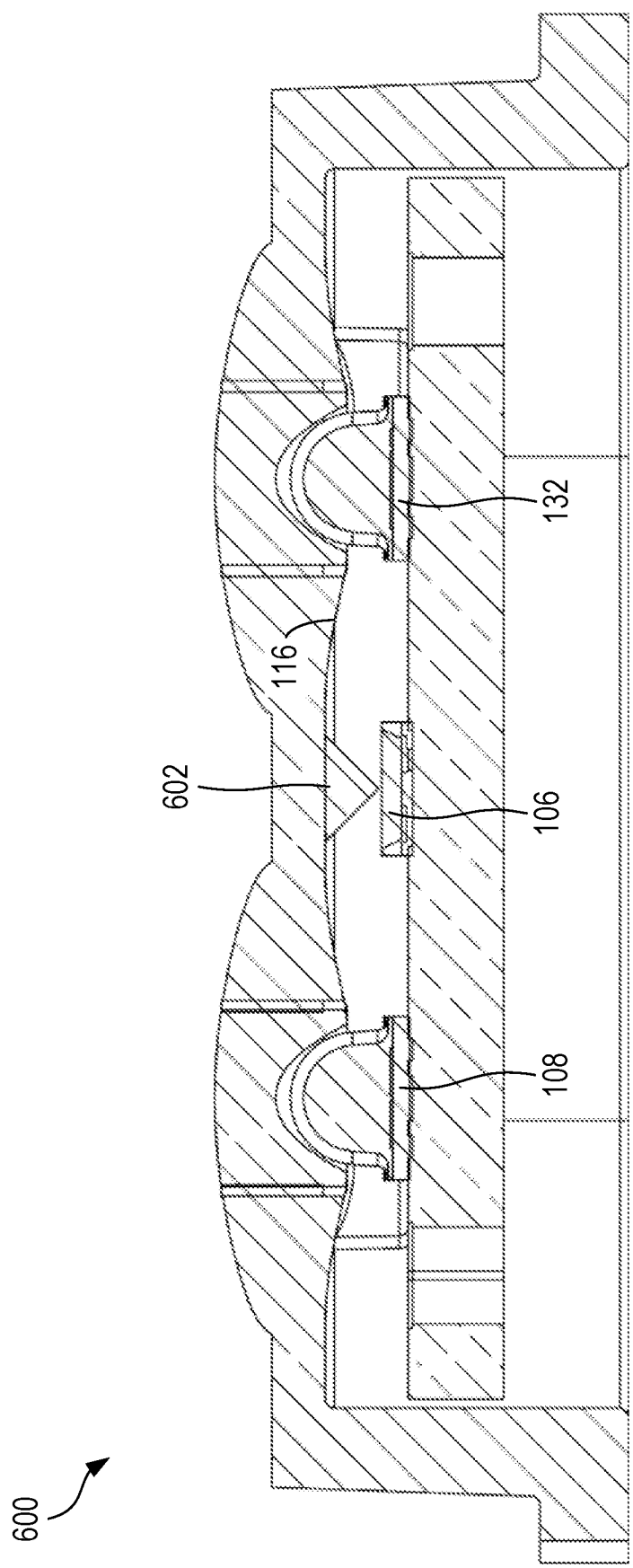
FIG. 6 shows a side-view cross-section of another example of a light-emitting apparatus, in accordance with some examples.

FIG. 6 shows a side-view cross-section of another example of a light-emitting apparatus 600, in accordance with some examples. Compared with the apparatus 100 of FIGS. 1 and 2, the apparatus 600 can additionally include a reflective prism 602 disposed between the visible light-emitting diode 106 and the incident surface 116 of the lens. Visible light from the visible light-emitting diode 106 can reflect from a face of the reflective prism 602 and pass toward the infrared light-emitting diode 108 and/or the second infrared light-emitting diode 132. The visible light can reflect from the infrared light-emitting diode 108 and/or the second infrared light-emitting diode 132 and be directed out of the light-emitting apparatus 600 along the same optical path as the infrared light that is generated at the infrared light-emitting diode 108 and/or the second infrared light-emitting diode 132. The reflective prism 602 of FIG. 6 can be used in combination with the cavity of FIGS. 1 and 2, or can replace the reflective material that forms the cavity of FIGS. 1 and 2. The reflective prism 602 of FIG. 6 can be used in combination with the cavity of FIGS. 1 and 2, or can replace the reflective material that forms the cavity of FIGS. 1 and 2. The reflective prism 602 can also be used in combination with the layer 302 of FIG. 3 or the layer 402 with holes 404 of FIG. 4.

Figure 7:
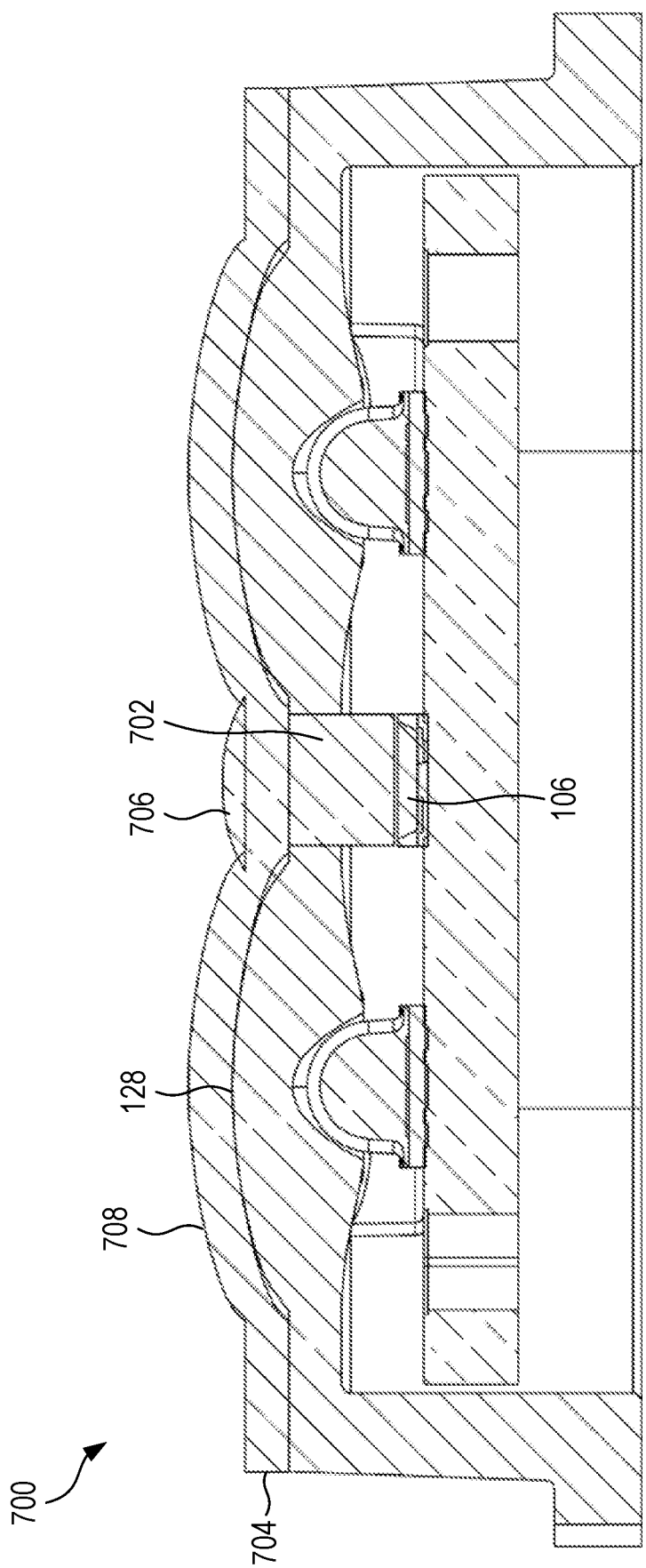
FIG. 7 shows a side-view cross-section of another example of a light-emitting apparatus, in accordance with some examples.

FIG. 7 shows a side-view cross-section of another example of a light-emitting apparatus 700, in accordance with some examples. Compared with the apparatus 100 of FIGS. 1 and 2, the apparatus 700 can additionally include a first light guide 702 positioned adjacent the visible light-emitting diode 106. The first light guide 702 can capture most or all of the visible light emitted from the visible light-emitting diode 106 and direct the captured visible light through the lens to a second light guide 704 positioned on the exiting surface 128 of the lens. The light guide 704 can optionally include a textured surface 708 opposite the exiting surface 128 of the lens, which can scatter the visible light away from the apparatus 700.

Figure 8:
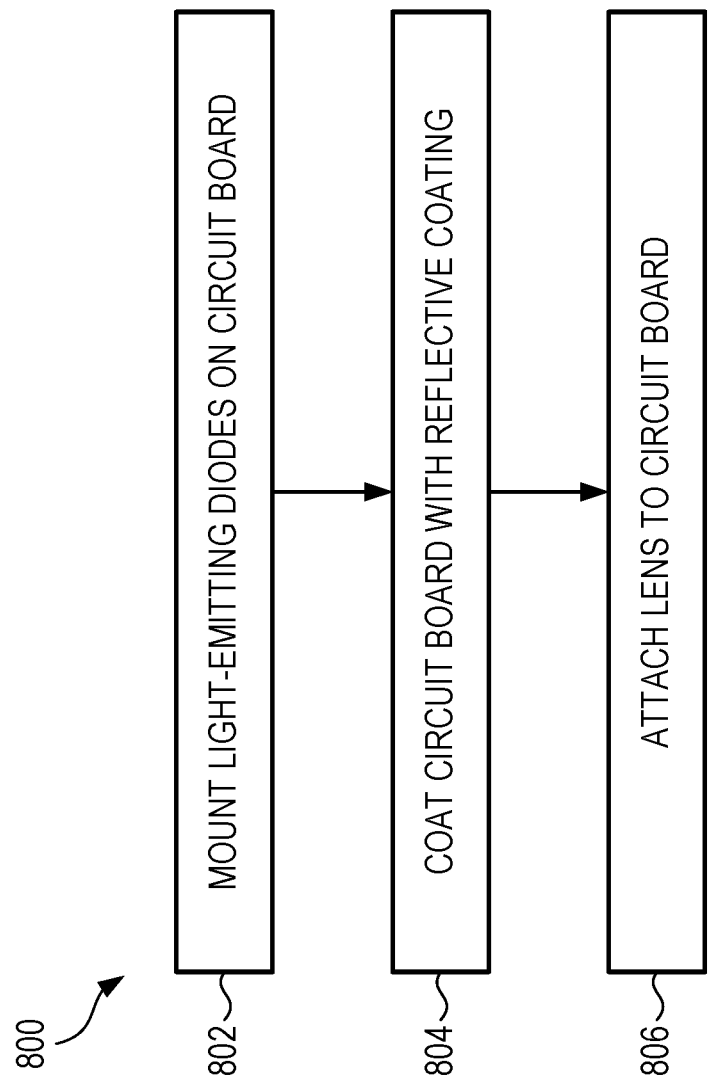
FIG. 8 shows a flow chart of an example of a method for forming a light-emitting apparatus, in accordance with some examples.

FIG. 8 shows a flow chart of an example of a method 800 for forming a light-emitting apparatus, in accordance with some examples. The method 800 can be used to form any of the apparatuses of FIGS. 1-7, among other apparatuses. The method 800 is but one method for forming a light-emitting apparatus; other suitable methods can also be used.

At operation 802, a visible light-emitting diode and an infrared light-emitting diode are mounted on a circuit board.

At operation 804, an area of the circuit board is coated with a coating that is reflective for visible light. The coated area of the circuit board at least partially surrounds the visible light-emitting diode and at least partially surrounds the infrared light-emitting diode.

At operation 806, a lens is attached to the circuit board. The lens includes an incident surface that faces the visible light-emitting diode and the infrared light-emitting diode. The incident surface is at least partially coated with a coating that is reflective for visible light. The incident surface includes a non-reflective area that lacks a reflective coating. The non-reflective area is positioned proximate the infrared light-emitting diode and can allow at least a portion of the visible light and at least a portion of the infrared light to pass through the incident surface of the lens. The lens can angularly redirect the infrared light and the visible light that passes through the non-reflective area.

To further illustrate the apparatus and related method disclosed herein, a non-limiting list of examples is provided below. Each of the following non-limiting examples can stand on its own or can be combined in any permutation or combination with any one or more of the other examples.

In Example 1, a light-emitting apparatus can include: a reflective cavity configured to reflect visible light within the reflective cavity, and allow the reflected visible light to exit the reflective cavity at one or more specified emission locations; a visible light-emitting diode configured to emit visible light into the reflective cavity; an infrared light-emitting diode configured to emit infrared light into the reflective cavity; and a lens configured to angularly redirect infrared light and visible light that exit the cavity through the one or more emission locations.

In Example 2, the light-emitting apparatus of Example 1 can optionally further include: a circuit board at least partially coated with a first coating that is reflective for visible light, such that the coated portion of the circuit board forms a portion of the reflective cavity, wherein the visible light-emitting diode, the infrared light-emitting diode, and the lens are mounted on the circuit board.

In Example 3, the light-emitting apparatus of any one of Examples 1-2 can optionally be configured such that: the lens includes an incident surface that faces the visible light-emitting diode and the infrared light-emitting diode; the incident surface is at least partially coated with a second coating that is reflective for visible light, such that the coated portion of the incident surface forms a portion of the reflective cavity; the incident surface includes a non-reflective area that lacks a reflective coating, such that the non-reflective area of the incident surface forms the one or more specified emission locations: and the non-reflective area is positioned proximate the infrared light-emitting diode and configured to allow at least a portion of the visible light and at least a portion of the infrared light to pass through the incident surface of the lens.

In Example 4, the light-emitting apparatus of any one of Examples 1-3 can optionally be configured such that: the visible light-emitting diode is oriented to emit the visible light in an angular distribution that is centered around a first axis; the infrared light-emitting diode is oriented to emit the infrared light in an angular distribution that is centered around a second axis; the second axis is generally parallel to the first axis; and the second axis extends from the infrared light-emitting diode to the non-reflective area.

In Example 5, the light-emitting apparatus of any one of Examples 1-4 can optionally be configured such that: the incident surface includes a generally planar portion that is at least partially coated with a third coating that is reflective for visible light; the incident surface includes a concave portion surrounded by the generally planar portion, the concave portion lacking a reflective coating and forming the non-reflective area.

In Example 6, the light-emitting apparatus of any one of Examples 1-5 can optionally be configured such that: the lens includes an exiting surface opposite the incident surface; the exiting surface includes a convex portion opposite the concave portion of the incident surface; and the concave portion of the incident surface and the convex portion of the exiting surface are shaped to angularly redirect the infrared light from the infrared light-emitting diode.

In Example 7, the light-emitting apparatus of any one of Examples 1-6 can optionally further include a second infrared light-emitting diode mounted on the circuit board and configured to emit infrared light.

In Example 8, the light-emitting apparatus of any one of Examples 1-7 can optionally be configured such that the visible light-emitting diode is positioned between the infrared light-emitting diode and the second infrared light-emitting diode.

In Example 9, the light-emitting apparatus of any one of Examples 1-8 can optionally be configured such that the incident surface includes a second non-reflective area that lacks a reflective coating, the second non-reflective area positioned proximate the second infrared light-emitting diode and configured to allow at least a portion of the visible light and at least a portion of the infrared light to pass through the incident surface of the lens.

In Example 10, the light-emitting apparatus of any one of Examples 1-9 can optionally be configured such that: the second infrared light-emitting diode is oriented to emit the infrared light in an angular distribution that is centered around a third axis; the third axis is generally parallel to the first axis and the second axis; and the third axis extends from the second infrared light-emitting diode to the second non-reflective area.

In Example 11, the light-emitting apparatus of any one of Examples 1-10 can optionally be configured such that the incident surface includes a second concave portion surrounded by the generally planar portion, the second concave portion lacking a reflective coating and forming the second non-reflective area.

In Example 12, the light-emitting apparatus of any one of Examples 1-11 can optionally be configured such that: the exiting surface includes a second convex portion opposite the second concave portion of the incident surface; and the second concave portion of the incident surface and the second convex portion of the exiting surface are shaped to angularly redirect the infrared light from the second infrared light-emitting diode.

In Example 13, the light-emitting apparatus of any one of Examples 1-12 can optionally be configured such that: a distance between the infrared light-emitting diode and the non-reflective area is substantially equal to a distance between the second infrared light-emitting diode and the second non-reflective area; a curvature of the concave portion of the incident surface is substantially equal to a curvature of the second concave portion of the incident surface; and a curvature of the convex portion of the exiting surface is substantially equal to a curvature of the second convex portion of the exiting surface.

In Example 14, the light-emitting apparatus of any one of Examples 1-13 can optionally be configured such that: the lens includes a flange configured to mechanically support the lens; the lens has an extension portion that extends from the flange to the incident surface; the extension portion is generally parallel to the first axis and the second axis; and the extension portion is at least partially coated with a coating that is reflective for visible light, such that the coated portion of the extension portion forms a portion of the reflective cavity.

In Example 15, a method for forming a light-emitting apparatus can include: mounting a visible light-emitting diode and an infrared light-emitting diode on a circuit board; coating an area of the circuit board with a coating that is reflective for visible light, the coated area of the circuit board at least partially surrounding the visible light-emitting diode and at least partially surrounding the infrared light-emitting diode; and attaching a lens to the circuit board, the lens including an incident surface that faces the visible light-emitting diode and the infrared light-emitting diode, the incident surface being at least partially coated with a coating that is reflective for visible light, the incident surface including a non-reflective area that lacks a reflective coating, the non-reflective area positioned proximate the infrared light-emitting diode and configured to allow at least a portion of the visible light and at least a portion of the infrared light to pass through the incident surface of the lens, the lens configured to angularly redirect the infrared light and the visible light that passes through the non-reflective area.

In Example 16, the method of Example 15 can optionally further include: orienting the visible light-emitting diode to emit the visible light in an angular distribution that is centered around a first axis; and orienting the infrared light-emitting diode to emit the infrared light in an angular distribution that is centered around a second axis, wherein: the second axis is generally parallel to the first axis; the second axis extends from the infrared light-emitting diode to the non-reflective area; the incident surface includes a generally planar portion that is at least partially coated with the coating that is reflective for visible light; the incident surface includes a concave portion surrounded by the generally planar portion, the concave portion lacking a reflective coating and forming the non-reflective area the lens includes an exiting surface opposite the incident surface; the exiting surface includes a convex portion opposite the concave portion of the incident surface; and the concave portion of the incident surface and the convex portion of the exiting surface are shaped to angularly redirect the infrared light from the infrared light-emitting diode.

In Example 17, the method of any one of Examples 15-16 can optionally be configured such that: a second infrared light-emitting diode is mounted on the circuit board and configured to emit infrared light, the incident surface includes a second non-reflective area that lacks a reflective coating, the second non-reflective area positioned proximate the second infrared light-emitting diode and configured to allow at least a portion of the visible light and at least a portion of the infrared light to pass through the incident surface of the lens; the second infrared light-emitting diode is oriented to emit the infrared light in an angular distribution that is centered around a third axis; the third axis is generally parallel to the first axis and the second axis; the third axis extends from the second infrared light-emitting diode to the second non-reflective area; the incident surface includes a second concave portion surrounded by the generally planar portion, the second concave portion lacking a reflective coating and forming the second non-reflective area; the exiting surface includes a second convex portion opposite the second concave portion of the incident surface; and the second concave portion of the incident surface and the second convex portion of the exiting surface are shaped to angularly redirect the infrared light from the second infrared light-emitting diode.

In Example 18, the method of any one of Examples 15-17 can optionally be configured such that: a distance between the infrared light-emitting diode and the non-reflective area is substantially equal to a distance between the second infrared light-emitting diode and the second non-reflective area; a curvature of the concave portion of the incident surface is substantially equal to a curvature of the second concave portion of the incident surface; and a curvature of the convex portion of the exiting surface is substantially equal to a curvature of the second convex portion of the exiting surface.

In Example 19, a light-emitting apparatus can include: a circuit board at least partially coated with a coating that is reflective for visible light; a visible light-emitting diode mounted on the circuit board and configured to emit visible light; an infrared light-emitting diode mounted on the circuit board and configured to emit infrared light; a second infrared light-emitting diode mounted on the circuit board and configured to emit infrared light, the visible light-emitting diode being positioned between the infrared light-emitting diode and the second infrared light-emitting diode, and a lens mounted on the circuit board, the lens including an incident surface that faces the visible light-emitting diode, the infrared light-emitting diode, and the second infrared light-emitting diode, the incident surface being at least partially coated with a coating that is reflective for visible light and positioned to reflect visible light toward the circuit board, the incident surface including a non-reflective area that lacks a reflective coating, the non-reflective area positioned proximate the infrared light-emitting diode and configured to allow at least a portion of the visible light and at least a portion of the infrared light to pass through the incident surface of the lens, the lens configured to angularly redirect the infrared light and the visible light that passes through the non-reflective area.

In Example 20, the light-emitting apparatus of Example 19 can optionally be configured such that: the visible light-emitting diode is oriented to emit the visible light in an angular distribution that is centered around a first axis; the infrared light-emitting diode is oriented to emit the infrared light in an angular distribution that is centered around a second axis; the second axis is generally parallel to the first axis; the second axis extends from the infrared light-emitting diode to the non-reflective area; the incident surface includes a generally planar portion that is at least partially coated with a coating that is reflective for visible light; the incident surface includes a concave portion surrounded by the generally planar portion, the concave portion lacking a reflective coating and forming the non-reflective area; the lens includes an exiting surface opposite the incident surface; the exiting surface includes a convex portion opposite the concave portion of the incident surface; the concave portion of the incident surface and the convex portion of the exiting surface are shaped to angularly redirect the infrared light from the infrared light-emitting diode; the lens includes a flange configured to mechanically support the lens; the lens has an extension portion that extends from the flange to the incident surface; the extension portion is generally parallel to the first axis and the second axis; and the extension portion is at least partially coated with a coating that is reflective for visible light.

While exemplary embodiments of the present disclosed subject matter have been shown and described herein, it will be obvious to those skilled in the art that such embodiments are provided by way of example only. Numerous variations, changes, and substitutions will now occur to those skilled in the art, upon reading and understanding the material provided herein, without departing from the disclosed subject matter. It should be understood that various alternatives to the embodiments of the disclosed subject matter described herein may be employed in practicing the various embodiments of the subject matter. It is intended that the following claims define the scope of the disclosed subject matter and that methods and structures within the scope of these claims and their equivalents be covered thereby.

What is claimed is:

1. A light-emitting apparatus, comprising:
a circuit board having a first planar surface;
a first infrared light-emitting diode mounted on the circuit board and configured to emit first infrared light;
a second infrared light-emitting diode mounted on the circuit board and configured to emit second infrared light;
a visible light-emitting diode mounted on the circuit board between the first infrared light-emitting diode and the second infrared light-emitting diode, the visible light-emitting diode configured to emit visible light; and
a lens having an incident surface that faces the first planar surface, the incident surface including a planar portion that is generally parallel to the first planar surface, the planar portion surrounding a first concave portion that is located opposite the first infrared light-emitting diode, the first concave portion configured to receive the first infrared light and direct the first infrared light through the lens, the planar portion surrounding a second concave portion that is located opposite the second infrared light-emitting diode, the second concave portion configured to receive the second infrared light and direct the second infrared light through the lens, the planar portion being coated with a reflective coating in a central area between the first concave portion and the second concave portion, the central area being positioned to receive and reflect the visible light.

2. The light-emitting apparatus of claim 1, wherein:
the visible light-emitting diode is oriented to emit the visible light in an angular distribution that is centered around a first axis;
the first infrared light-emitting diode is oriented to emit the first infrared light in an angular distribution that is centered around a second axis that is generally parallel to the first axis; and
the second infrared light-emitting diode is oriented to emit the second infrared light in an angular distribution that is centered around a third axis that is generally parallel to the first axis and the second axis.

3. The light-emitting apparatus of claim 1, wherein:
the lens includes an exiting surface opposite the incident surface;
the exiting surface includes a first convex portion opposite the first concave portion of the incident surface and a second convex portion opposite the second concave portion of the incident surface;
the first concave portion of the incident surface and the first convex portion of the exiting surface are shaped to angularly redirect the first infrared light; and
the second concave portion of the incident surface and the second convex portion of the exiting surface are shaped to angularly redirect the second infrared light.

4. The light-emitting apparatus of claim 3, wherein:
a distance between the first infrared light-emitting diode and first concave portion is substantially equal to a distance between the second infrared light-emitting diode and the second concave portion;
a curvature of the first concave portion of the incident surface is substantially equal to a curvature of the second concave portion of the incident surface; and
a curvature of the first convex portion of the exiting surface is substantially equal to a curvature of the second convex portion of the exiting surface.

5. The light-emitting apparatus of claim 2, wherein:
the lens includes a flange configured to mechanically support the lens;
the lens has an extension portion that extends from the flange to the incident surface;
the extension portion is generally parallel to the first axis, the second axis, and the third axis; and
the extension portion is at least partially coated with a coating that is reflective for visible light.

6. A light-emitting apparatus, comprising:
a circuit board at least partially coated with a coating that is reflective for visible light;
a visible light-emitting diode mounted on the circuit board and configured to emit visible light;
a first infrared light-emitting diode mounted on the circuit board and configured to emit first infrared light;
a second infrared light-emitting diode mounted on the circuit board and configured to emit second infrared light, the visible light-emitting diode being positioned between the infrared light-emitting diode and the second infrared light-emitting diode; and
a lens mounted on the circuit board,
the lens including an incident surface that faces the visible light-emitting diode, the first infrared light-emitting diode, and the second infrared light-emitting diode,
the incident surface being at least partially coated with a coating that is reflective for visible light and positioned to reflect visible light toward the circuit board,
the incident surface including a first non-reflective area that is located opposite the first infrared light-emitting diode and a second non-reflective area that is located opposite the second infrared light-emitting diode,
the first non-reflective area and the second non-reflective area lacking a reflective coating,
the first non-reflective area configured to allow at least a portion of the visible light and at least a portion of the first infrared light to pass through the incident surface of the lens,
the lens configured to angularly redirect the first infrared light and the visible light that pass through the incident surface of the lens,
the second non-reflective area configured to allow at least a portion of the visible light and at least a portion of the second infrared light to pass through the incident surface of the lens,
the lens configured to angularly redirect the second infrared light and the visible light that pass through the incident surface of the lens.

7. The light-emitting apparatus of claim 6, wherein:
the visible light-emitting diode is oriented to emit the visible light in an angular distribution that is centered around a first axis;
the first infrared light-emitting diode is oriented to emit the first infrared light in an angular distribution that is centered around a second axis;

the second axis is generally parallel to the first axis;

the second axis extends from the first infrared light-emitting diode to the first non-reflective area;

the incident surface includes a generally planar portion that is at least partially coated with a coating that is reflective for visible light;

the incident surface includes a first concave portion surrounded by the generally planar portion, the first concave portion lacking a reflective coating and forming the first non-reflective area;

the incident surface includes a second concave portion surrounded by the generally planar portion, the second concave portion lacking a reflective coating and forming the second non-reflective area;

the lens includes an exiting surface opposite the incident surface;

the exiting surface includes a first convex portion opposite the first concave portion of the incident surface and a second convex portion opposite the second concave portion of the incident surface;

the first concave portion of the incident surface and the first convex portion of the exiting surface are shaped to angularly redirect the first infrared light;

the second concave portion of the incident surface and the second convex portion of the exiting surface are shaped to angularly redirect the second infrared light;

the lens includes a flange configured to mechanically support the lens;

the lens has an extension portion that extends from the flange to the incident surface;

the extension portion is generally parallel to the first axis and the second axis; and the extension portion is at least partially coated with a coating that is reflective for visible light.

\* \* \* \* \*

UNITED STATES PATENT AND TRADEMARK OFFICE
CERTIFICATE OF CORRECTION

PATENT NO. : 11,417,796 B2
APPLICATION NO. : 16/701867
DATED : August 16, 2022
INVENTOR(S) : Aas et al.

It is certified that error appears in the above-identified patent and that said Letters Patent is hereby corrected as shown below:

In the Claims

In Column 14, Line 3, in Claim 4, after "and", insert --the--

Signed and Sealed this
Fourth Day of October, 2022

Katherine Kelly Vidal
*Director of the United States Patent and Trademark Office*